US012793752B2

(12) United States Patent
Chang et al.

(10) Patent No.: US 12,793,752 B2
(45) Date of Patent: Nov. 10, 2026

(54) MEMORY STRUCTURE WITH THREE BIT LINES TO A MEMORY CELL, MEMORY, AND MEMORY SYSTEM

(71) Applicant: YANGTZE MEMORY TECHNOLOGIES CO., LTD., Wuhan (CN)

(72) Inventors: Cheng Chang, Wuhan (CN); Dong He, Wuhan (CN); Lin Miao, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 167 days.

(21) Appl. No.: 18/798,603

(22) Filed: Aug. 8, 2024

(65) Prior Publication Data

US 2025/0329354 A1 Oct. 23, 2025

(30) Foreign Application Priority Data

Apr. 17, 2024 (CN) ........................ 202410465256.3

(51) Int. Cl.

| | |
|---|---|
| ***G11C 7/10*** | (2006.01) |
| ***G11C 5/02*** | (2006.01) |
| ***G11C 7/12*** | (2006.01) |
| ***G11C 8/10*** | (2006.01) |
| ***G11C 8/12*** | (2006.01) |
| ***G11C 11/4094*** | (2006.01) |
| ***G11C 29/26*** | (2006.01) |

(Continued)

(52) U.S. Cl.

CPC ............ *G11C 7/1069* (2013.01); *G11C 5/025* (2013.01); *G11C 7/1057* (2013.01); *G11C 7/12* (2013.01); *G11C 8/10* (2013.01); *G11C 8/12* (2013.01); *G11C 11/4094* (2013.01); *G11C 29/26* (2013.01); *G11C 29/28* (2013.01); *H10B 12/482* (2023.02); *H10B 12/488* (2023.02)

(58) Field of Classification Search

CPC ..... G11C 7/1069; G11C 5/025; G11C 7/1057; G11C 7/12; G11C 8/10; G11C 8/12; G11C 11/4094; G11C 29/26; G11C 29/28; G11C 16/24; H10B 12/482; H10B 12/488

See application file for complete search history.

(56) References Cited

U.S. PATENT DOCUMENTS 9,286,998 B1 * 3/2016 Singh ..................... G11C 17/12
2012/0155162 A1 * 6/2012 Hanzawa ........... G11C 13/0069 365/163

(Continued)

*Primary Examiner* — Donald H B Braswell
(74) *Attorney, Agent, or Firm* — Conley Rose, P.C.

(57) ABSTRACT

Implementations of the present disclosure provide a memory structure, a memory, and a memory system. The memory structure includes: a plurality of memory transistors arranged in an array along a first direction and a second direction; and a plurality of bit line groups extending along the first direction and arranged along the second direction, each of which includes a first, second, and third bit lines extending along the first direction and arranged along a third direction; wherein the memory transistor is connected to any one of the first, second, and third bit lines in the same bit line group, or the memory transistor is not connected to the first, second, and third bit lines in the same bit line group; the first direction intersects with the second direction, and both of the first and second directions are perpendicular to the third direction.

20 Claims, 12 Drawing Sheets

(51) Int. Cl.
*G11C 29/28* (2006.01)
*H10B 12/00* (2023.01)

(56) References Cited

U.S. PATENT DOCUMENTS

| | | | | |
|---|---|---|---|---|
| 2015/0109851 | A1* | 4/2015 | Higo | G11C 13/003 365/148 |
| 2020/0312379 | A1* | 10/2020 | Lim | G11C 8/08 |
| 2022/0415370 | A1* | 12/2022 | Chen | G11C 7/1087 |

* cited by examiner

| CODE TRUTH DIAGRAM OF A MEMORY STRUCTURE PROVIDED IN A FIRST IMPLEMENTATION | | | | |
|---|---|---|---|---|
| WHETHER FIRST SOURCE/DRAIN IS GROUNDED OR NOT | X | √ | √ | √ |
| M2-CODING | X | √ | X | X |
| M3-CODING | X | X | √ | X |
| M4-CODING | X | X | X | √ |
| Dout1-Dout0 | 00 | 01 | 10 | 11 |
| G | X : NOT CONNECTED | | | |

FIG. 7

| CODE TRUTH DIAGRAM OF A MEMORY STRUCTURE PROVIDED IN A SECOND IMPLEMENTATION | | | | |
|---|---|---|---|---|
| M2-CODING | X | √ | X | X |
| M3-CODING | X | X | √ | X |
| M4-CODING | X | X | X | √ |
| Dout1-Dout0 | 00 | 01 | 10 | 11 |
| √ : CONNECTED | | X : NOT CONNECTED | | |

FIG. 10

MEMORY STRUCTURE WITH THREE BIT LINES TO A MEMORY CELL, MEMORY, AND MEMORY SYSTEM

CROSS-REFERENCE TO RELATED APPLICATIONS

The present application claims priority to Chinese Patent Application No. 2024104652563, which was filed Apr. 17, 2024, is titled "STORAGE STRUCTURE, MEMORY AND MEMORY SYSTEM," and is hereby incorporated herein by reference in its entirety.

TECHNICAL FIELD

Implementations of the present disclosure relate to the field of semiconductor technology, particularly to a memory structure, a memory, and a memory system.

BACKGROUND

Usually, memories can be classified into a non-volatile memory (NVM) and a volatile memory, namely a random access memory (RAM), wherein the non-volatile memory can maintain its stored data when not powered on, while the volatile memory cannot maintain its stored data when not powered on. The non-volatile memory comprises a read-only memory (ROM) and a flash memory, while the volatile memory comprises a static random access memory (SRAM) and a dynamic random access memory (DRAM). The read-only memory can further comprise a mask ROM (MROM), a programmable ROM (PROM), an erasable programmable ROM (EPROM), and an electrically erasable programmable ROM (EEPROM).

At present, the data stored in the mask type read-only memory can only be customized by users, and the programmed content required by the users can be achieved through the mask process in the integrated circuit manufacturing process. However, one memory transistor in the read-only memory can only store one bit of data.

SUMMARY

In view of this, implementations of the present disclosure provide a memory structure, a memory, and a memory system.

To achieve the above objectives, the technical solutions of the present disclosure are implemented as follows:

In a first aspect, an implementation of the present disclosure provides a memory structure, wherein the memory structure comprises: a plurality of memory transistors arranged in an array along a first direction and a second direction; and a plurality of bit line groups extending along the first direction and arranged along the second direction, each of which comprises a first bit line, a second bit line, and a third bit line extending along the first direction and arranged along a third direction; wherein the memory transistor is connected to any one of the first bit line, the second bit line, and the third bit line in the same bit line group, or the memory transistor is not connected to the first bit line, the second bit line, and the third bit line in the same bit line group; the first direction intersects with the second direction, and both of the first direction and the second direction are perpendicular to the third direction.

In some implementations, the memory structure further comprises: a plurality of connection pads, wherein the memory transistor is connected to any one of the first bit line, the second bit line and the third bit line in the same bit line group through the connection pad.

In some implementations, the plurality of connection pads comprise: a first connection pad, a second connection pad and a third connection pad; wherein the memory transistor is connected to the first bit line through the first connection pad, or the memory transistor is connected to the second bit line through the second connection pad, or the memory transistor is connected to the third bit line through the third connection pad.

In some implementations, different data stored in the memory transistor is determined based on a connection relationship between the memory transistor and the different connection pads.

In some implementations, a number of data "01" stored in the memory structure is determined based on a number of the first connection pad; a number of data "10" stored in the memory structure is determined based on a number of the second connection pad; and a number of data "11" stored in the memory structure is determined based on a number of the third connection pad.

In some implementations, the memory structure further comprises: a first metal layer, a second metal layer and a third metal layer sequentially connected to the memory transistor; wherein the first metal layer is configured to connect the memory transistor and the first connection pad, the second metal layer is configured to connect the memory transistor and the second connection pad, and the third metal layer is configured to connect the memory transistor and the third connection pad.

In some implementations, when data "00" is stored in the memory transistor, the memory transistor is not connected to the first bit line, the second bit line and the third bit line in the same bit line group; when data "01" is stored in the memory transistor, the memory transistor is connected to the first bit line through the first metal layer and the first connection pad; when data "10" is stored in the memory transistor, the memory transistor is connected to the second bit line through the second metal layer and the second connection pad; and when data "11" is stored in the memory transistor, the memory transistor is connected to the third bit line through the third metal layer and the third connection pad.

In some implementations, the memory transistor comprises a gate, and the memory structure further comprises: a plurality of word lines extending along the second direction and arranged along the first direction, with each of the word lines connected to the gates of the plurality of memory transistors arranged along the second direction.

In some implementations, the word line is located at the fourth metal layer; and wherein the fourth metal layer is located at a layer different from each of the first metal layer, the second metal layer and the third metal layer.

In some implementations, the memory structure further comprises: a plurality of ground lines extending along the second direction and arranged along the first direction.

In some implementations, the memory transistor comprises a first source/drain and a second source/drain; and the memory structure further comprises: a plurality of connection pillars configured to connect the first source/drain of the memory transistor to the ground line, and the first sources/drains of the plurality of memory transistors arranged along the second direction are connected to the same ground line.

In some implementations, two of the memory transistors adjacent along the first direction share the same first source/drain; and two of the memory transistors adjacent along the first direction share the same ground line.

In a second aspect, an implementation of the present disclosure provide a memory which comprises: the memory structure of the aforementioned technical solutions; and a peripheral circuit coupled to the memory structure.

In some implementations, the peripheral circuit comprises: a plurality of multiplexers, each of which is connected to one bit line in each of the bit line groups; wherein a number of the multiplexers is the same as a number of the bit lines.

In some implementations, the peripheral circuit further comprises: an address decoder connected to the plurality of multiplexers and configured to determine a selected memory transistor of the plurality of memory transistors.

In some implementations, the peripheral circuit further comprises: a first sensing amplifier configured to sense a first potential on the first bit line corresponding to the selected memory transistor; a second sensing amplifier configured to sense a second potential on the second bit line corresponding to the selected memory transistor; and a third sensing amplifier configured to sense a third potential on the third bit line corresponding to the selected memory transistor.

In some implementations, the peripheral circuit further comprises: a coder connected to the first sensing amplifier, the second sensing amplifier and the third sensing amplifier and configured to determine data stored in the selected memory transistor based on the first potential, the second potential, and the third potential.

In some implementations, two bits of data are stored in the memory transistor, and the peripheral circuit further comprises: a first buffer connected to the coder and configured to store one bit of data of the selected memory transistor; and a second buffer connected to the coder and configured to store another bit of data in the selected memory transistor.

In some implementations, the memory comprises: a read-only memory.

In a third aspect, an implementation of the present disclosure provides a memory system, wherein the memory system comprises: a memory device configured to store data; and a controller coupled to the memory device and configured to control the memory device, and the controller comprises the memory of the aforementioned technical solutions.

Implementations of the present disclosure provide a memory structure, a memory, and a memory system. In an implementation of the present disclosure, the memory structure comprises: a plurality of memory transistors arranged in an array along a first direction and a second direction; and a plurality of bit line groups extending along the first direction and arranged along the second direction, each of which comprises a first bit line, a second bit line, and a third bit line extending along the first direction and arranged along a third direction. The data stored in the memory transistor is determined by a connection relationship between the memory transistor and the first bit line, the second bit line, and the third bit line in the bit line group. As such, each memory transistor in the memory structure can store 2 bits of data, which can improve the storage density of the memory structure.

BRIEF DESCRIPTION OF DRAWINGS

FIG. 7 is a code truth diagram of the memory structure provided in the first implementation of the present disclosure;

FIG. 10 is a code truth diagram of the memory structure provided in the second implementation of the present disclosure;

DETAILED DESCRIPTION

Figure 1:
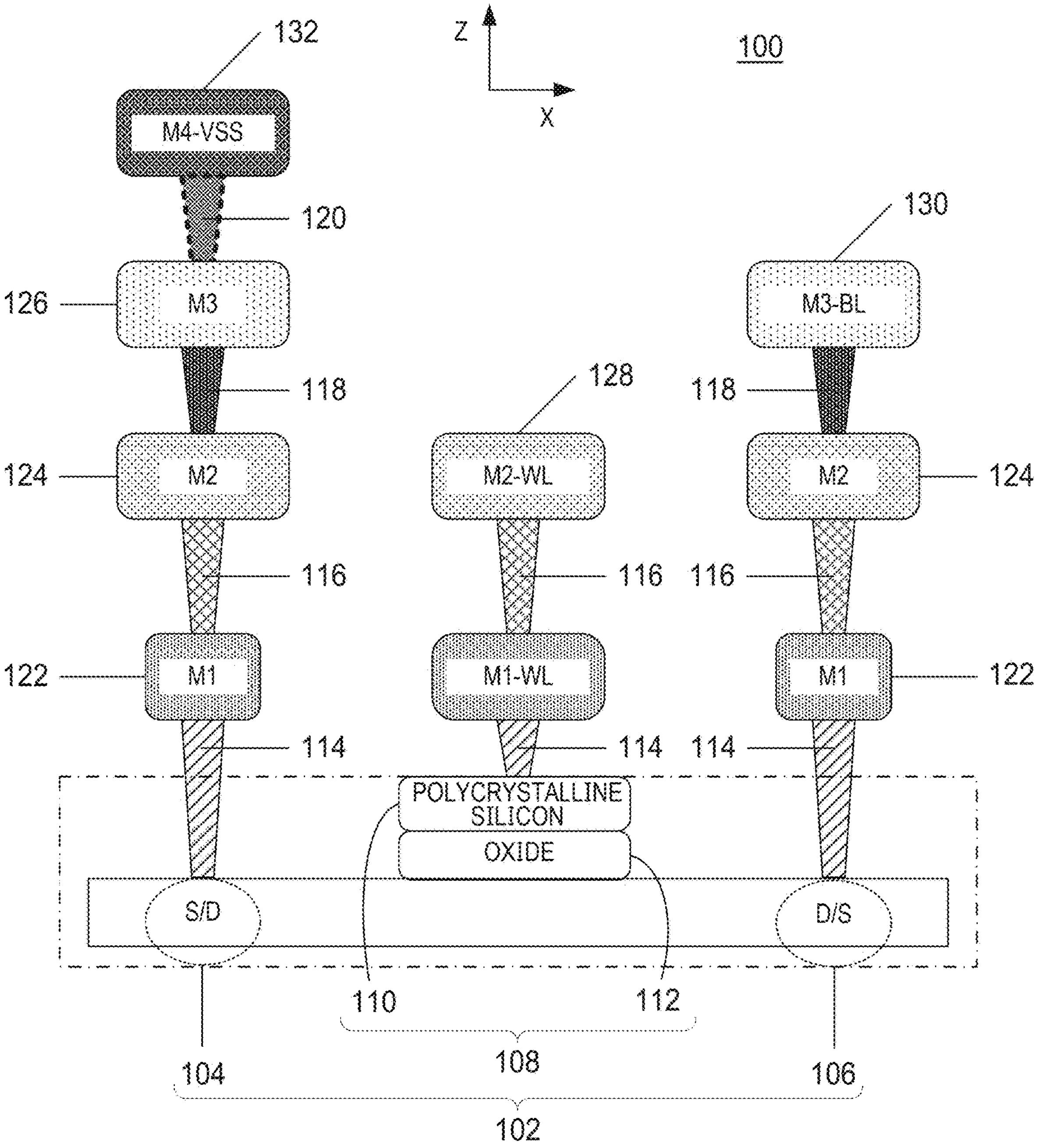
FIG. 1 is a structure schematic diagram of a memory structure provided in an example.

The following will provide a clear and complete description of the technical solutions in the implementations of the present disclosure in conjunction with the implementations of the present disclosure and the accompanying drawings. It is apparent that the described implementations are only a part of the implementations of the present disclosure and not all of them. Based on the implementations in the present disclosure, all other implementations obtained by those skilled in the art without creative work fall within the scope of protection of the present disclosure.

In the following description, a large number of example details are provided to provide a more thorough understanding of the present disclosure. However, it is apparent to those skilled in the art that the present disclosure can be implemented without the need for one or more of these details. In other examples, in order to avoid confusion with the present disclosure, some well-known technical features in the field will not been described; that is to say, not all the features of the actual implementations are described here, and the well-known functions and structures are not described in detail.

In the accompanying drawings, for clarity, the dimensions of layers, regions, and components, as well as their relative dimensions, may be exaggerated. The same reference numbers indicate the same components throughout.

It should be understood that when a component or layer is referred to as "on", "adjacent to", "connected to" or "coupled to" other components or layers, it can be directly on, adjacent to, connected to or coupled to other components or layers, or an intermediate component or layer can exist therebetween. On the contrary, when a component is referred to as "directly on", "directly adjacent to", "directly connected to" or "directly coupled to" other components or layers, there is no intermediate component or layer. It should be understood that although the terms "first", "second", "third", etc. may be employed to describe at least one of various components, members, regions, layers, or parts, the at least one of these components, members, regions, layers, or parts should not be limited by these terms. These terms are only employed to distinguish one component, member, region, layer or part from another component, member, region, layer or part. Therefore, without departing from the present disclosure, a first component, member, region, layer or part discussed below may be represented as a second component, member, region, layer or part. When discussing the second component, member, region, layer or part, it does not necessarily mean that there exists the first component, member, region, layer or part in the present disclosure.

Spatial relationship terms such as "below", "underneath", "lower", "under", "over", "upper", etc. can be employed here for convenience to describe the relationship between a component or feature and other components or features shown in the drawings. It should be understood that, in addition to the orientation shown in the drawing, the spatial relationship term also intends to comprise different orientations of the devices in use and operation. For example, if the device in the accompanying drawing is turned over, then the component or feature described as "underneath" or "under" or "below" other components will be oriented "on" the other components or features. Therefore, the example terms "underneath" and "under" may comprise both up and down orientations. The device can be oriented otherwise (rotated 90 degrees or in other orientations) and the spatial description used here is explained accordingly.

The purpose of the terms used here is only to describe example implementations and is not a limitation of the present disclosure. When used here, "a", "an", and "said/the" in singular form are also intended to comprise plural forms, unless the context clearly indicates otherwise. It should also be understood that at least one of the term "consist of" or "comprise", when used in the description, determine the presence of at least one of the features, integers, steps, operations, components, or members, but do not exclude the presence or addition of at least one of one or more other features, integers, steps, operations, components, members, or groups. When used here, the term "at least one of" comprises any and all combinations of related listed items.

In order to fully understand the present disclosure, detailed operations and structures will be proposed in the following description to illustrate the technical solutions of the present disclosure. The example implementations of the present disclosure are described in detail below, however, in addition to these detailed descriptions, there may be other implementations of the present disclosure.

Typically, a read-only memory can serve as a hardware memory structure for microcontroller unit (MCU) hardware instructions. At present, the data stored in the mask type read-only memory can only be customized by users, and the programmed content required by the users can be achieved through the mask process in the integrated circuit manufacturing process.

However, the read-only memory is usually a two-dimensional matrix array structure, wherein one memory transistor can only store one bit of data (1T 1 bit). Therefore, the storage density of the mask type read-only memory needs further improvement.

Before introducing the implementations of the present disclosure, various directions that may be involved in the following description are defined first. A direction in which a bit line extends is defined as a first direction, e.g. Y direction; a direction in which a word line extends is defined as a second direction, e.g. X direction; wherein the X and Y directions intersect. A third direction, namely Z direction, is defined; wherein both the X and Y directions are perpendicular to the Z direction. In some implementations, the X, Y, and Z directions are perpendicular to each other.

Referring to FIG. 1, FIG. 1 is a structure schematic diagram of a memory structure provided in an example. As shown in FIG. 1, a memory structure 100 may comprise a plurality of memory transistors 102 (as shown by the dotted box in FIG. 1) arranged in an array along the X and Y directions. The memory transistor 102 may comprise a first source/drain 104 (as shown by the dashed circle in FIG. 1), a second source/drain 106 (as shown by the dashed circle in FIG. 1), and a gate 108 located between the first source/drain 104 and the second source/drain 106. For example, the first source/drain 104 can be a source (S) and the second source/drain 106 can be a drain (D); alternatively, the first source/drain 104 can be the drain and the second source/drain 106 can be the source. The gate 108 comprises a gate electrode layer 110 and a gate dielectric layer 112. A material of the gate electrode layer 110 can be, for example, polycrystalline silicon (Poly), and a material of the gate dielectric layer 112 can be, for example, oxide (OX). Here, the memory transistor 102 can be an N-type metal oxide semiconductor (NMOS) transistor.

The gate 108 of the memory transistor 102 can be connected to a word line located in a first metal layer (M1-WL as shown in FIG. 1) through a first contact hole 114 (for example, PC1), and the word line located in the first metal layer can be connected to the word line located in a second metal layer (M2-WL as shown in FIG. 1) through a second contact hole 116 (for example, V1P), that is, the gate 108 of the memory transistor 102 is connected to the word line 128. Here, the memory structure 100 may comprise a plurality of word lines 128 extending along the X direction and arranged along the Y direction.

The second source/drain 106 of the memory transistor 102 can be sequentially connected to the first metal layer 122 (M1 as shown in FIG. 1) through the first contact hole 114 (for example, PC1), connected to the second metal layer 124 (M2 as shown in FIG. 1) through the second contact hole 116 (for example, V1P), and connected to a bit line located in a third metal layer (M3-BL as shown in FIG. 1) through a third contact hole 118 (for example, V2P), that is, the second source/drain 106 of the memory transistor 102 is connected to the bit line 130. Here, the memory structure 100 may comprise a plurality of bit lines 130 extending along the Y direction and arranged along the X direction.

The first source/drain 104 of the memory transistor 102 can be sequentially connected to the first metal layer 122 (M1 as shown in FIG. 1) through the first contact hole 114 (for example, PC1), connected to the second metal layer 124 (M2 as shown in FIG. 1) through the second contact hole 116 (for example, V1P), connected to the third metal layer 126 (M3 as shown in FIG. 1) through the third contact hole 118 (for example, V2P), and connected to a ground line located in a fourth metal layer (M4-VSS as shown in FIG. 1) through a coding contact hole 120 (e.g. V3P-coding), that is, the first source/drain 104 of the memory transistor 102 is connected to the ground line 132.

It should be noted that FIG. 1 illustrates the coding contact hole 120 as a dashed box, since the coding contact hole 120 can be provided or not provided in the memory transistor 102 of the memory structure 100. Here, the coding way for the memory structure in the read-only memory can be to achieve 0 and 1 coding of the memory transistor by providing or not providing a coding contact hole connected to the first source/drain, that is, by coding the coding contact hole on the first source/drain. The first source/drain 104 in the memory structure 100 shown in FIG. 1 is connected to the ground line 132 through the coding contact hole 120.

Here, in the case of the coding contact hole being provided on the first source/drain, the gate of the memory transistor is connected to the word line, the second source/drain is connected to the bit line, and the first source/drain is connected to the ground line; when the word line and the bit line are connected to a high potential and the ground line is grounded, the memory transistor is turned on and a corresponding bit line potential decreases. In this case, the data stored in the memory transistor is defined as "1". In the case of the coding contact hole being not provided on the first source/drain, the gate of the memory transistor is connected to the word line, the second source/drain is connected to the bit line, and the first source/drain is not connected to the ground line; when the word line and the bit line are connected to the high potential, the memory transistor is not turned on and the corresponding bit line potential does not decrease. In this case, the data stored in the memory transistor is defined as "0". Therefore, the programming of the memory transistors can be achieved by providing or not providing the coding contact hole on the first source/drains.

Figure 2:
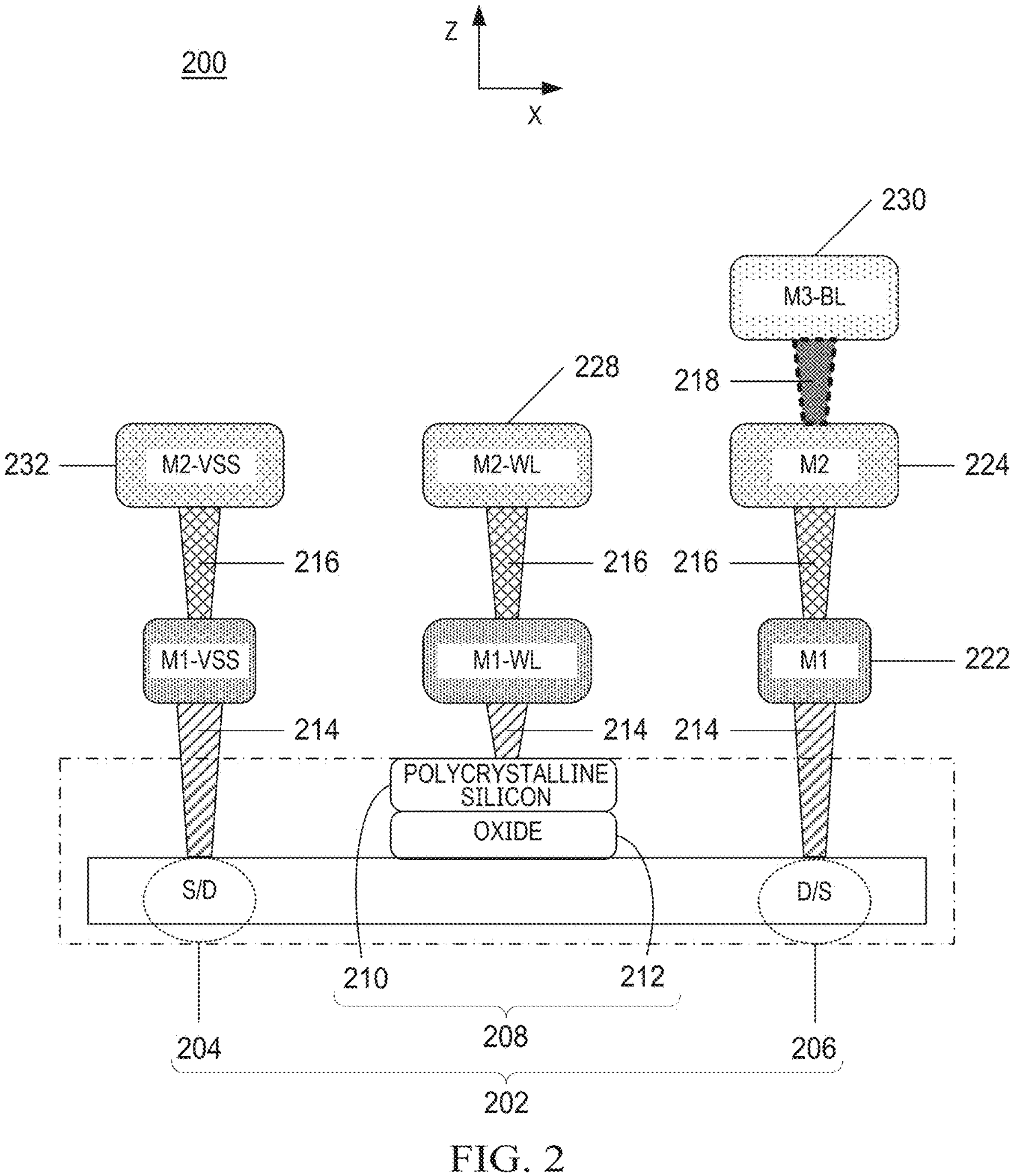
FIG. 2 is a structure schematic diagram of a memory structure provided in another example.

Referring to FIG. 2, FIG. 2 is a structure schematic diagram of a memory structure provided in another example. As shown in FIG. 2, the memory structure 200 may comprise a plurality of memory transistors 202 (as shown by the dotted box in FIG. 2) arranged in an array along the X and Y directions. The memory transistor 202 may comprise a first source/drain 204 (as shown by the dashed circle in FIG. 2), a second source/drain 206 (as shown by the dashed circle in FIG. 2), and a gate 208 located between the first source/drain 204 and the second source/drain 206. The gate 208 comprises a gate electrode layer 210 and a gate dielectric layer 212.

The gate 208 of the memory transistor 202 can be connected to a word line (M1-WL as shown in FIG. 2) located in a first metal layer through a first contact hole 214 (for example, PC1), and thus the word line located in the first metal layer can be connected to a word line (M2-WL as shown in FIG. 2) located in a second metal layer through a second contact hole 216 (for example, V1P), that is, the gate 208 of the memory transistor 202 can be connected to the word line 228.

The first source/drain 204 of the memory transistor 202 can be sequentially connected to a ground line (M1-VSS as shown in FIG. 2) located in the first metal layer through the first contact hole 214 (for example, PC1), and connected to a ground line (M2-VSS as shown in FIG. 2) located in the second metal layer through the second contact hole 216 (for example, V1P), that is, the first source/drain 204 of the memory transistor 202 is connected to the ground line 232.

The second source/drain 206 of the memory transistor 202 can be sequentially connected to the first metal layer 222 (M1 as shown in FIG. 2) through the first contact hole 214 (for example, PC1), connected to the second metal layer 224 (M2 as shown in FIG. 2) through the second contact hole 216 (for example, V1P), and connected to a bit line (M3-BL as shown in FIG. 2) located in a third metal layer through the coding contact hole 218 (for example, V2P-coding), that is, the second source/drain 206 of the memory transistor 202 is connected to the bit line 230.

It should be noted that FIG. 2 illustrates the coding contact hole 218 as a dashed box, since the coding contact hole 218 can be provided or not provided in the memory transistor 202 of the memory structure 200. Here, the coding way for the memory structure in the read-only memory can be to achieve "0" and "1" coding of the memory transistor by providing or not providing the coding contact hole connected to the second source/drain, that is, by coding the coding contact hole on the second source/drain. The second source/drain 206 in the memory structure 200 shown in FIG. 2 is connected to the bit line 230 through the coding contact hole 218.

Here, in the case of the coding contact hole being provided on the second source/drain, the gate of the memory transistor is connected to the word line, the first source/drain is connected to the ground line, and the second source/drain is connected to the bit line; when the word line and the bit line are connected to a high potential and the ground line is grounded, the memory transistor is turned on and a corresponding bit line potential decreases. In this case, the data stored in the memory transistor is defined as "1". In the case of the coding contact hole being not provided on the second source/drain, the gate of the memory transistor is connected to the word line, the first source/drain is connected to the ground line, and the second source/drain is not connected to the bit line; when the word line is connected to the high potential and the ground line is grounded, the memory transistor is not turned on and a corresponding bit line potential does not decrease. In this case, the data stored in the memory transistor is defined as "0". Therefore, the programming of the memory transistors can be achieved by providing or not providing the coding contact hole on the second source/drain.

In the above technical solution, the programming of the memory transistors can be achieved by providing or not providing the coding contact hole on the first source/drain and connecting or not connecting the first source/drain to the ground line; and the programming of the memory transistors can also be achieved by providing or not providing the coding contact hole on the second source/drain and connecting or not connecting the second source/drain to the bit line. That is to say, the stored data "0" and "1" can be expressed by the connection way of the first source/drain or the second source/drain of the memory transistor.

Figure 3:
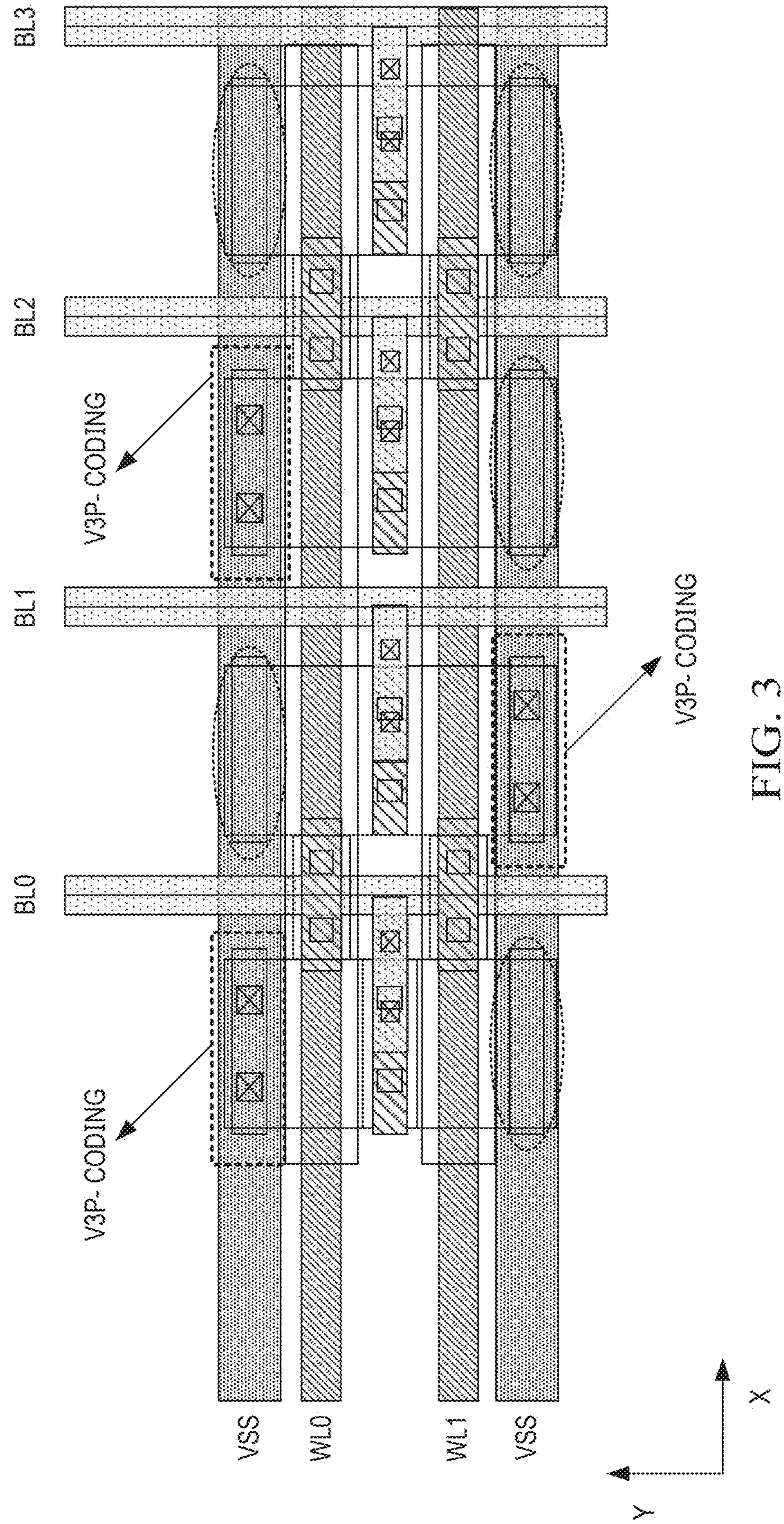
FIG. 3 is a layout of a memory structure provided in an example.

Referring to FIG. 3, FIG. 3 is a layout of a memory structure provided in an example. As shown in FIG. 3, the memory structure comprises: a plurality of memory transistors arranged in an array along the X and Y directions, for example, 8 memory transistors arranged in 2 rows×4 columns; a plurality of bit lines extending along the Y direction and arranged sequentially along the X direction, namely BL0, BL1, BL2, and BL3 respectively; a plurality of word lines extending along the X direction and arranged sequentially along the Y direction, namely WL0 and WL1 respectively; and a plurality of ground lines extending along the X direction and arranged sequentially along the Y direction, for example, VSS.

Combining with FIG. 1, as shown by the dashed box in FIG. 3, the memory structure in the read-only memory can be coded through the coding contact hole. In the case of providing the coding contact hole (for example, V3P-coding) on the first source/drain, the first source/drain of the memory transistor is connected to the ground line through the coding contact hole, and in this case, the data stored in the memory transistor is "1". Combining with FIG. 1, as shown by the dashed circle in FIG. 3, in the case of not providing the coding contact hole (for example, V3P-coding) on the first source/drain, the first source/drain of the memory transistor is not connected to the ground line, and in this case, the data stored in the memory transistor is "0". In the memory structure shown in FIG. 3, data is stored as "1" in three memory transistors and as "0" in five memory transistors.

Figure 4:
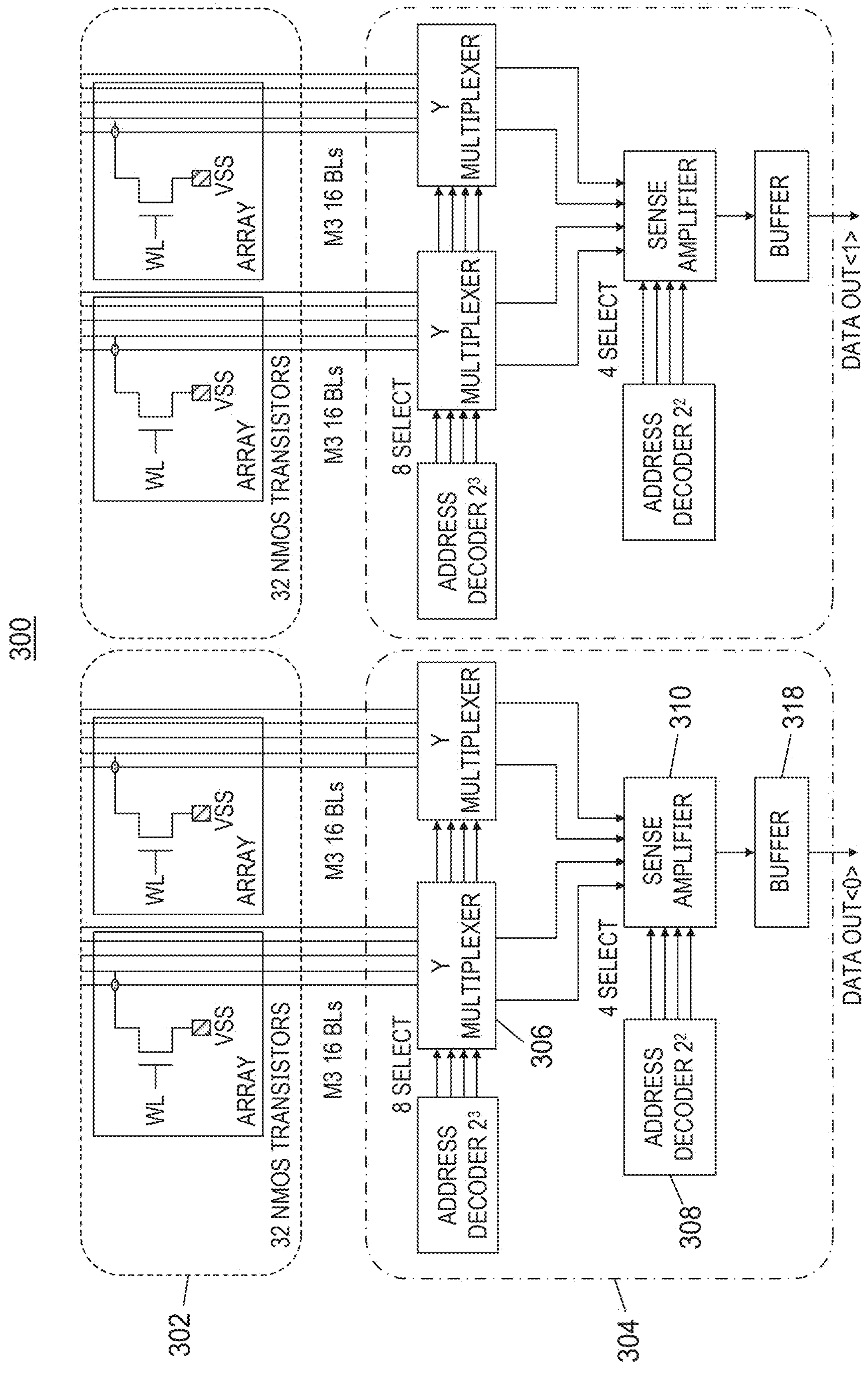
FIG. 4 is a schematic diagram of a read-only memory with a peripheral circuit provided in an example.

Referring to FIG. 4, FIG. 4 is a schematic diagram of a read-only memory with a peripheral circuit provided in an example. As shown in FIG. 4, the read-only memory 300 comprises a memory structure 302 and a peripheral circuit 304, wherein the memory structure 302 comprises a plurality of memory transistors (for example, NMOS transistors) arranged in an array along the X and Y directions. The dashed box in FIG. 4 illustrates 32 NMOS transistors, with the gate of each NMOS transistor connected to one word line, the first source/drain (for example, source) of each NMOS transistor connected to the ground line, and the second source/drain (for example, drain) of each NMOS transistor connected to one bit line correspondingly. As such, the 32 NMOS transistors are connected to 32 bit lines correspondingly. Combining with FIG. 2, the programing of the NMOS transistor is achieved by connecting or not connecting the second source/drain (for example, drain) of the NMOS transistor to the bit line.

The dotted box in FIG. 4 illustrates the peripheral circuit 304, which comprises a plurality of Y multiplexers 306 (YMUX), with each bit line connected to one Y multiplexer 306; an address decoder 308 connected to the Y multiplexer 306, which determines $(\frac{1}{2}^{3})\times 32$ bit lines of the 32 bit lines first, e.g. first determining 4 bit lines; furthermore, the address decoder 308 determines $(\frac{1}{2}^{2})\times 4$ bit lines of the 4 bit lines, e.g. subsequently determining 1 bit line; a sense amplifier 310 (SA) connected to the bit line and configured to sense a sensing potential on the above determined bit line and determine the data stored in the NMOS transistor based on the sensing potential on the bit line; and a buffer 318 connected to the sensing amplifier 310 and configured to store data and output 1 bit of data, e.g. data out<0>. Similarly, the 32 NMOS transistors can be further configured to output another bit of data, e.g. data out<1>.

In the above technical solution, one memory transistor in the read-only memory can store only one bit of data. Therefore, the storage density of the mask type read-only memory needs further improvement.

Figure 5:
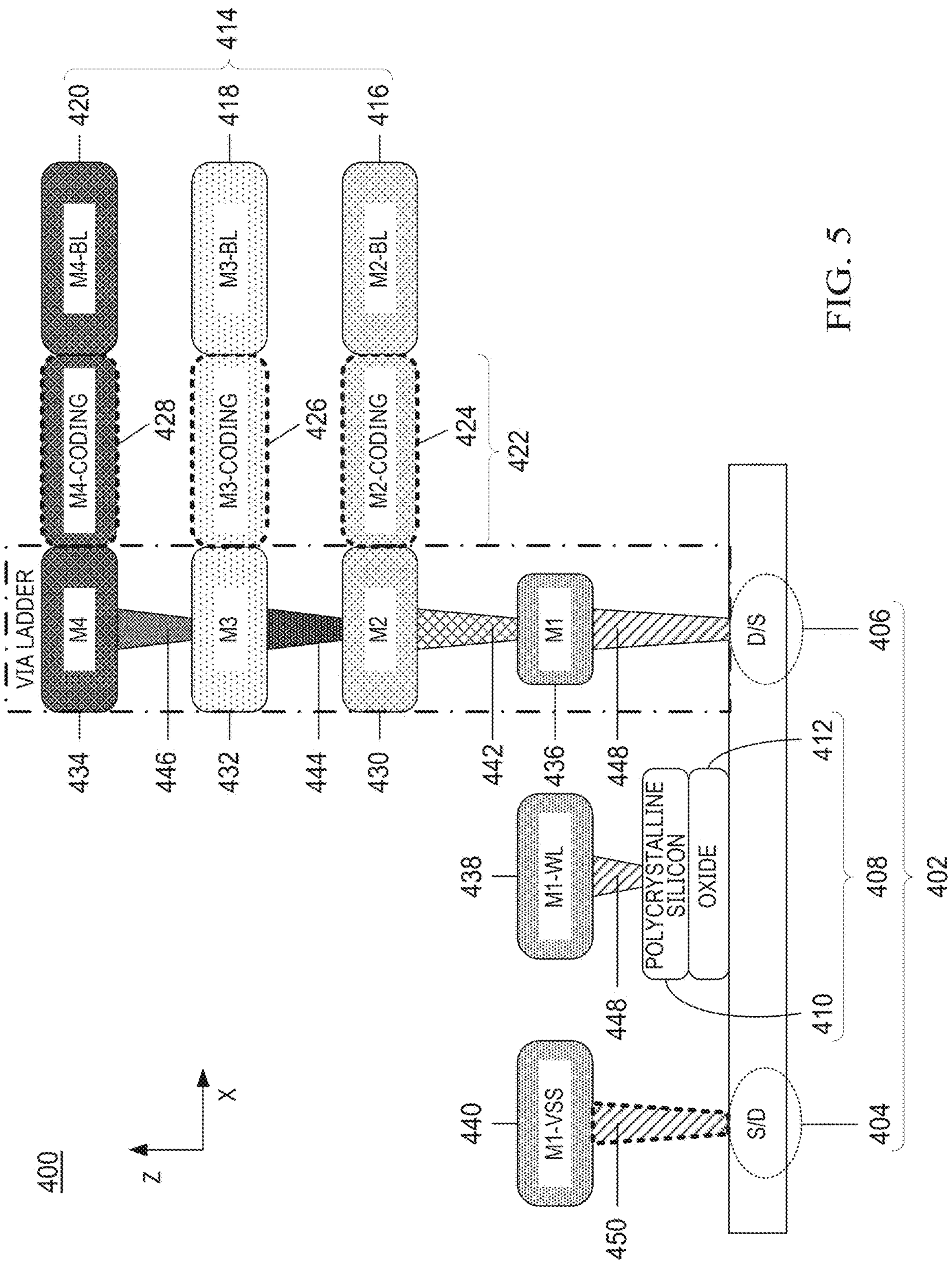
FIG. 5 is a structure schematic diagram of a memory structure provided in a first implementation of the present disclosure.

Referring to FIG. 5, FIG. 5 is a structure schematic diagram of a memory structure provided in a first implementation of the present disclosure. As shown in FIG. 5, the implementation of the present disclosure provides a memory structure 400, which comprises: a plurality of memory transistors 402 arranged in an array along the X and Y directions; a plurality of bit line groups 414 extending in the Y direction and arranged in the X direction, each bit line group 414 comprising a first bit line 416, a second bit line 418, and a third bit line 420 extending in the Y direction and arranged in the Z direction; wherein the memory transistor 402 is connected to any one of the first bit line 416, the second bit line 418, and the third bit line 420 in the same bit line group 414; alternatively, the memory transistor 402 is not connected to the first bit line 416, the second bit line 418, and the third bit line 420 in the same bit line group 414; the X direction and the Y direction intersect, and the X direction and the Y direction are perpendicular to the Z direction.

Here, the memory transistor 402 can comprise a first source/drain 404 (as shown by the dashed circle in FIG. 5), a second source/drain 406 (as shown by the dashed circle in FIG. 5), and a gate 408 located between the first source/drain 404 and the second source/drain 406. The gate 408 comprises a gate electrode layer 410 and a gate dielectric layer 412.

Here, the memory transistor 402 can be an NMOS transistor.

In some implementations, a material of the gate electrode layer 410 may be, for example, polycrystalline silicon (Poly), and a material of the gate dielectric layer 412 may be, for example, oxide (OX).

In some implementations, the first source/drain may be a source, and the corresponding second source/drain may be a drain. In other implementations, the first source/drain may be the drain, and the corresponding second source/drain may be the source.

For example, the method of forming the memory transistor 402 may comprise: sequentially forming the gate dielectric layer and the gate electrode layer on a substrate to form the gate; performing ion implantation on the substrate on two sides of the gate opposite along the X direction to form two doping regions respectively, namely forming the first source/drain and the second source/drain. There are no special limitations on the operations of forming the memory transistor 402 in the present disclosure, and the above operations of forming the memory transistor 402 are only for illustrative purposes.

Here, the different data stored in the memory transistor 402 can be determined based on the connection relationship between the second source/drain 406 of the memory transistor 402 and the first bit line 416, the second bit line 418, and the third bit line 420 in the same bit line group 414. A plurality of bit line groups 414 extend in the Y direction and are arranged in the X direction. The second sources/drains 406 of the plurality of memory transistors 402 arranged in the Y direction are connected to the same bit line group 414. In an example, the second source/drain 406 of the memory transistor 402 may not be connected to the first bit line 416, the second bit line 418, and the third bit line 420 in the same bit line group 414, alternatively, the second source/drain 406 of the memory transistor 402 may be connected to any one of the first bit line 416, the second bit line 418, and the third bit line 420 in the same bit line group 414. As such, there exist four different connection ways between the second source/drain of the memory transistor and the three bit lines in the same bit line group, that is, the memory transistor can store two bits of data.

Here, the first bit line 416, the second bit line 418, and the third bit line 420 in the same bit line group 414 all extend along the Y direction and are arranged sequentially along the Z direction; wherein the first bit line 416, the second bit line 418, and the third bit line 420 can be located at different metal layers. In an example, the first bit line 416 can be located at the first metal layer, as shown by M2-BL in FIG. 5, the second bit line 418 can be located at the second metal layer, as shown by M3-BL in FIG. 5, and the third bit line 420 can be located at the third metal layer, as shown by M4-BL in FIG. 5.

Here, that the first bit line 416, the second bit line 418, and the third bit line 420 in the same bit line group 414 are located at different metal layers means that the first bit line 416, the second bit line 418, and the third bit line 420 in the same bit line group 414 have different heights in the Z direction. The first bit line 416 and the first metal layer 430 (M2 as shown in FIG. 5) have the same height, the second bit line 418 and the second metal layer 432 (M3 as shown in FIG. 5) have the same height, and the third bit line 420 and the third metal layer 434 (M4 as shown in FIG. 5) have the same height, wherein the height of the first metal layer M2 is lower than that of the second metal layer M3, and the height of the second metal layer M3 is lower than that of the third metal layer M4.

In some implementations, projections of the first bit line 416, the second bit line 418, and the third bit line 420 in the same bit line group 414 on the XY plane do not completely overlap. As such, the parasitic capacitance among the first bit line 416, the second bit line 418, and the third bit line 420 can be reduced.

In some implementations, the memory structure 400 further comprises: a plurality of connection pads 422, and the memory transistor 402 is connected to any one of the first bit line 416, the second bit line 418, and the third bit line 420 in the same bit line group 414 through the connection pads 422.

Here, each memory transistor 402 can only be connected to any one of the first bit line 416, the second bit line 418, and the third bit line 420 in the same bit line group 414 through one connection pad 422.

In an implementation of the present disclosure, by providing or not providing the connection pad connected to the second source/drain, and by setting which bit line in the same bit line group the connection pad is connected to, e.g. by coding the connection pad, the coding of the memory transistor 402 is achieved, so that 2 bits of data can be stored in one memory transistor.

In some implementations, a plurality of connection pads 422 comprise: a first connection pad 424, a second connection pad 426, and a third connection pad 428; wherein the memory transistor 402 is connected to the first bit line 416 through the first connection pad 424, that is, the first connection pad 424 can be coded (for example, M2-coding); alternatively, the memory transistor 402 can be connected to the second bit line 418 through the second connection pad 426, that is, the second connection pad 426 can be coded (for example, M3-coding); alternatively, the memory transistor 402 can be connected to the third bit line 420 through the third connection pad 428, that is, the third connection pad 428 can be coded (for example, M4-coding).

It should be noted that the first connection pad 424, the second connection pad 426, and the third connection pad 428 are all shown with a dashed box in FIG. 5. This is because the memory transistor 402 of the memory structure 400 can be provided with the first connection pad 424 or not provided with the first connection pad 424, or provided with the second connection pad 426 or not provided with the second connection pad 426, or provided with the third connection pad 428 or not provided with the third connection pad 428. In an implementation of the present disclosure, the coding of the memory transistor 402 can be achieved by coding the first connection pad 424, the second connection pad 426 and the third connection pad 428, e.g. by providing or not providing the first connection pad 424, the second connection pad 426 and the third connection pad 428.

For example, the first connection pad 424, the second connection pad 426, and the third connection pad 428 may not be provided, and the second source/drain 406 of the memory transistor 402 is not connected to any one of the bit lines in the bit line group 414. Still for example, the first connection pad 424 can be provided without providing the second connection pad 426 and the third connection pad 428, and the second source/drain 406 of the memory transistor 402 can be connected to the first bit line 416 in the bit line group 414 through the first connection pad 424. Still for example, the second connection pad 426 can be provided without providing the first connection pad 424 and the third connection pad 428, and the second source/drain 406 of the memory transistor 402 is connected to the second bit line 418 in the bit line group 414 through the second connection pad 426. Still for example, the third connection pad 428 can be provided without providing the first connection pad 424 and the second connection pad 426, and the second source/drain 406 of the memory transistor 402 can be connected to the third bit line 420 in the bit line group 414 through the third connection pad 428. As such, there exist four different connection ways between the second source/drain of the memory transistor 402 and the three bit lines in the same bit line group 414, and the memory transistor 402 can store two bits of data.

In some implementations, different data stored in the memory transistor 402 is determined based on the connection relationship between the second source/drain 406 of the memory transistor 402 and different connection pads 422.

In some implementations, the number of data “01” stored in the memory structure 400 is determined based on the number of the first connection pads 424; the number of data “10” stored in the memory structure 400 is determined based on the number of the second connection pads 426; the number of data “11” stored in the memory structure 400 is determined based on the number of the third connection pads 428. It should be noted that when storing data “00” in the memory structure 400, there is no need for the first connection pad 424, the second connection pad 426, or the third connection pad 428.

Here, the first connection pad 424 can be provided without providing the second connection pad 426 and the third connection pad 428, and the second source/drain 406 of the memory transistor 402 is connected to the first bit line 416 in the bit line group 414 through the first connection pad 424. In this case, data “01” is stored in the memory transistor 402. As such, the number of data “01” stored in the memory structure 400 can be determined based on the number of the first connection pads in the memory structure 400.

Here, the second connection pad 426 can be provided without providing the first connection pad 424 and the third connection pad 428, and the second source/drain 406 of the memory transistor 402 is connected to the second bit line 418 in the bit line group 414 through the second connection pad 426. In this case, data “10” is stored in the memory transistor 402. As such, the number of data “10” stored in the memory structure 400 can be determined based on the number of the second connection pads in the memory structure 400.

Here, the third connection pad 428 can be provided without providing the first connection pad 424 and the second connection pad 426, and the second source/drain 406 of the memory transistor 402 is connected to the third bit line 420 in the bit line group 414 through the third connection pad 428. In this case, data “11” is stored in the memory transistor 402. As such, the number of data “11” stored in the memory structure 400 can be determined based on the number of the third connection pads in the memory structure 400.

In some implementations, the memory structure 400 further comprises: a first metal layer 430, a second metal layer 432, and a third metal layer 434 sequentially connected to the memory transistor 402; wherein the first metal layer 430 is configured to connect the second source/drain 406 of the memory transistor 402 and the first connection pad 424, the second metal layer 432 is configured to connect the second source/drain 406 of the memory transistor 402 and the second connection pad 426, and the third metal layer 434 is configured to connect the second source/drain 406 of the memory transistor 402 and the third connection pad 428.

Here, the first metal layer 430, the second metal layer 432, and the third metal layer 434 have different heights along the Z direction. The second source/drain 406 of the memory transistor 402 is sequentially connected to the first metal layer 430 (M2 as shown in FIG. 5) through the first contact structure 442 (for example, V1P), to the second metal layer 432 (M3 as shown in FIG. 5) through the second contact structure 444 (for example, V2P), and to the third metal layer 434 (M4 as shown in FIG. 5) through the third contact structure 446 (for example, V3P).

In some implementations, when storing data "00" in the memory transistor 402, the memory transistor 402 is not connected to the first bit line 416, the second bit line 418, and the third bit line 420 in the same bit line group 414; when storing data "01" in the memory transistor 402, the memory transistor 402 is connected to the first bit line 416 through the first metal layer 430 and the first connection pad 424; when storing data "10" in the memory transistor 402, the memory transistor 402 is connected to the second bit line 418 through the second metal layer 432 and the second connection pad 426; and when storing data "11" in the memory transistor 402, the memory transistor 402 is connected to the third bit line 420 through the third metal layer 434 and the third connection pad 428.

Here, in the case of not providing the first connection pad 424, the second connection pad 426, and the third connection pad 428, the second source/drain 406 of the memory transistor 402 is not connected to any one of the bit lines in the bit line group 414; in this case, data "00" is stored in the memory transistor 402.

Here, in the case of providing the first connection pad 424 without providing the second connection pad 426 and the third connection pad 428, the second source/drain 406 of the memory transistor 402 can be connected to the first bit line 416 in the bit line group 414 through the first contact structure 442 (for example, V1P), the first metal layer 430 (M2 as shown in FIG. 5), and the first connection pad 424 sequentially; in this case, data "01" is stored in the memory transistor 402.

Here, in the case of providing the second connection pad 426 without providing the first connection pad 424 and the third connection pad 428, the second source/drain 406 of the memory transistor 402 can be connected to the second bit line 418 in the bit line group 414 through the first contact structure 442 (for example, V1P), the first metal layer 430 (M2 as shown in FIG. 5), the second contact structure 444 (for example, V2P), the second metal layer 432 (M3 as shown in FIG. 5), and the second connection pad 426 sequentially. In this case, data "10" is stored in the memory transistor 402.

Here, in the case of providing the third connection pad 428 without providing the first connection pad 424 and the second connection pad 426, the second source/drain 406 of the memory transistor 402 can be connected to the third bit line 420 in the bit line group 414 through the first contact structure 442 (for example, V1P), the first metal layer 430 (M2 as shown in FIG. 5), the second contact structure 444 (for example, V2P), the second metal layer 432 (M3 as shown in FIG. 5), the third contact structure 446 (for example, V3P), the third metal layer 434 (M4 as shown in FIG. 5), and the third connection pad 428 sequentially. In this case, data "11" is stored in the memory transistor 402.

In some implementations, the memory structure 400 further comprises: a plurality of word lines 438 extending along the X direction and arranged along the Y direction, the word lines 438 each being connected to the gates 408 of the plurality of memory transistors 402 arranged along the X direction.

In some implementations, the word line 438 is located at the fourth metal layer 436 (M1 as shown in FIG. 5); wherein the fourth metal layer 436 is located at a layer different from the first metal layer 430, the second metal layer 432 and the third metal layer 434.

Here, the gate 408 of the memory transistor 402 is connected to the word line 438, M1-WL as shown in FIG. 5, located at the fourth metal layer through the fourth contact structure 448 (for example, PC1). In addition, the second source/drain 406 of the memory transistor 402 also needs to be connected to the fourth metal layer 436 through the fourth contact structure 448 (for example, PC1) first, and then connected to different bit lines through different contact structures, different metal layers, and different connection pads.

It should be noted that the word line 438 extends along the X direction, and the first bit line 416, the second bit line 418, and the third bit line 420 in the bit line group 414 all extend in the Y direction. Therefore, the word line 438 is located in a metal layer different from the first bit line 416, the second bit line 418, and the third bit line 420 in the bit line group 414.

In some implementations, the height of the fourth metal layer 436 is lower than the height of the first metal layer 430.

Here, the second source/drain 406 of the memory transistor 402 can be sequentially connected to the fourth metal layer 436 through the fourth contact structure 448 (for example, PC1), to the first metal layer 430 through the first contact structure 442 (for example, V1P), to the second metal layer 432 through the second contact structure 444 (for example, V2P), and to the third metal layer 434 through the third contact structure 446 (for example, V3P).

In an implementation of the present disclosure, the second source/drain 406 of the memory transistor 402 can be connected to different metal layers through different contact structures to form a via ladder/via pillar, as shown by the dotted box in FIG. 5. The first bit line 416, the second bit line 418, and the third bit line 420 in the same bit line group 414 located at different heights can be connected to the via ladder through a metal option. For example, the metal option between the first bit line 416 and the via ladder is the first connection pad 424, the metal option between the second bit line 418 and the via ladder is the second connection pad 426, and the metal option between the third bit line 420 and the via ladder is the third connection pad 428.

In some implementations, the memory structure 400 further comprises: a plurality of ground lines 440 extending along the X direction and arranged in the Y direction. Here, the coding of the memory transistor 402 can also be achieved by providing or not providing the coding contact structure 450 (e.g. PC1-coding) connected to the first source/drain 404, that is, by coding the coding contact structure 450 on the first source/drain 404. It should be noted that FIG. 5 illustrates the coding contact structure 450 as a dashed box. This is because the coding contact structure 450 can be provided or not provided in the memory transistor 402 of the memory structure 400. The first source/drain 404 of the memory transistor 402 illustrated in FIG. 5 is connected to the ground line 440 (M1-VSS as shown in FIG. 5) located in the fourth metal layer through the coding contact structure 450.

It should be noted that the word line 438 extends along the X direction, and the ground line 440 extends along the X direction. Therefore, the word line 438 and the ground line 440 can be located at the same metal layer.

Figure 6:
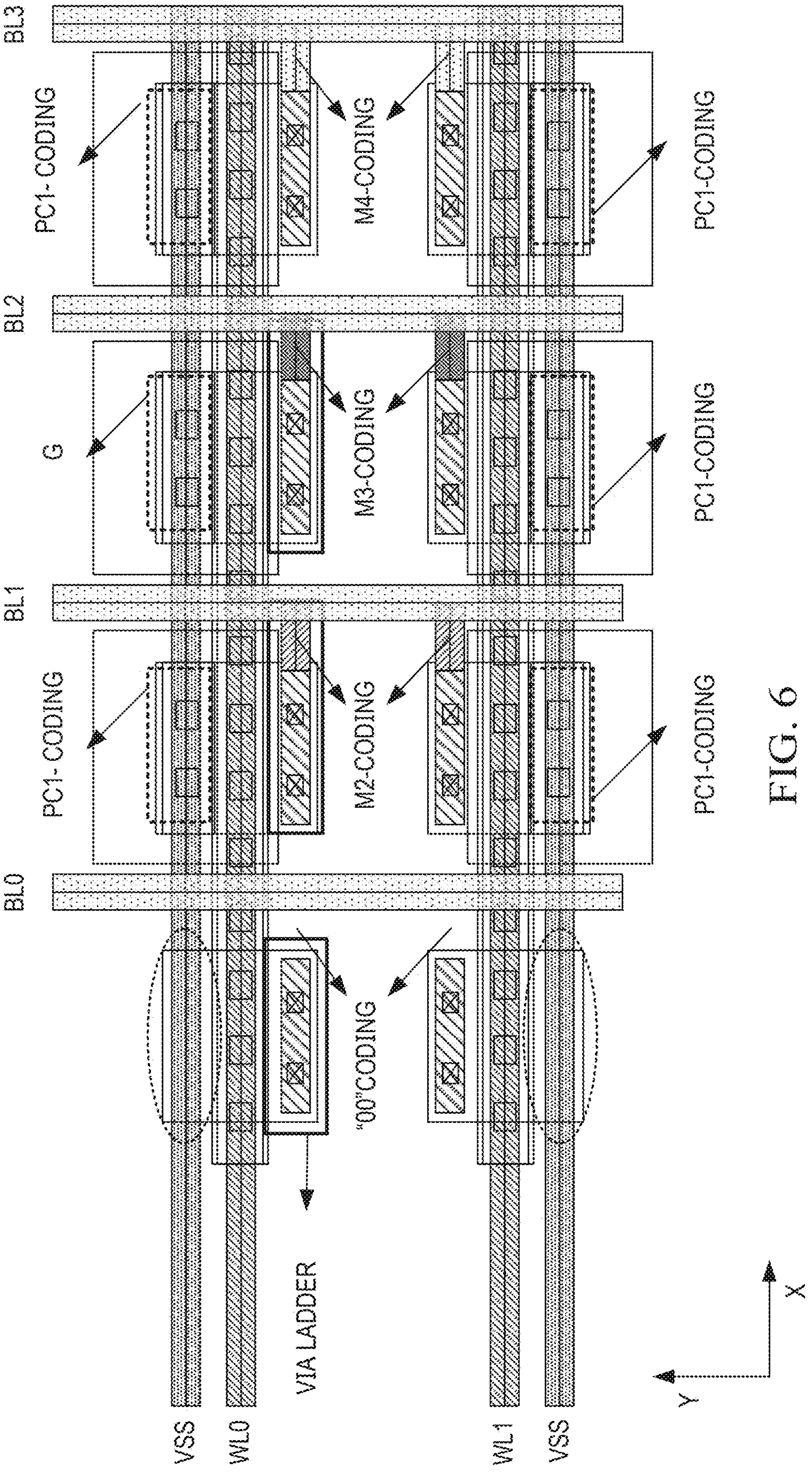
FIG. 6 is a layout of the memory structure provided in the first implementation of the present disclosure.

Referring to FIG. 6, FIG. 6 is a layout of the memory structure 400 provided in the first implementation of the present disclosure. As shown in FIG. 6, the memory structure comprises: a plurality of memory transistors arranged in an array along the X and Y directions, for example, 8 memory transistors arranged in 2 rows×4 columns; a plurality of bit line groups extending along the Y direction and arranged sequentially along the X direction, namely BL0, BL1, BL2, and BL3 respectively; a plurality of word lines extending along the X direction and arranged sequentially along the Y direction, namely WL0 and WL1 respectively; and a plurality of ground lines such as VSS extending along the X direction and arranged sequentially along the Y direction.

Combining with FIG. 5, as shown by the dashed circle in FIG. 6, in the case that no coding contact structure is provided on the first source/drain and no first connection pad, second connection pad, and third connection pad are provided on the second source/drain, the first source/drain of the memory transistor located in the first row and also in the first column and the first source/drain of the memory transistor located in the second row and also in the first column are not connected to the ground line, and both of the second sources/drains of the two memory transistors are not connected to any one of the bit lines in the bit line group BL0, and the gates of the two memory transistors are respectively connected to the word lines WL0 and WL1; in this case, the data stored in both of the two memory transistors is "00", which is the "00" coding shown in FIG. 6.

Combining with FIG. 5, as shown by the dashed box in FIG. 6, in the case of providing the coding contact structure (PC1-coding as shown in FIG. 6) on the first source/drain and providing the first connection pad on the second source/drain without providing the second connection pad and the third connection pad on the second source/drain, the first source/drain of the memory transistor located in the first row and also in the second column and the first source/drain of the memory transistor located in the second row and also in the second column are respectively connected to different ground lines (VSS), the second sources/drains of the two memory transistors are both connected to the first bit line in the bit line group BL1 (M2-coding as shown in FIG. 6), and the gates of the two memory transistors are respectively connected to the word lines WL0 and WL1; in this case, the data stored in both memory transistors each is "01".

Combining with FIG. 5, as shown by the dashed box in FIG. 6, in the case of providing the coding contact structure (PC1-coding as shown in FIG. 6) on the first source/drain and providing the second connection pad on the second source/drain without providing the first and third connection pads on the second source/drain, the first source/drain of the memory transistor located in the first row and also in the third column and the first source/drain of the memory transistor located in the second row and also the third column are connected to different ground lines (VSS), the second sources/drains of the memory transistors are both connected to the second bit line in the bit line group BL2 (M3-coding as shown in FIG. 6), and the gates of the two memory transistors are respectively connected to the word lines WL0 and WL1; in this case, the data stored in both memory transistors each is "10".

Combining with FIG. 5, as shown by the dashed box in FIG. 6, in the case of providing the coding contact structure (PC1-coding as shown in FIG. 6) on the first source/drain and providing the third connection pad on the second source/drain without providing first and second connection pads on the second source/drain, the first source/drain of the memory transistor located in the first row and also in the fourth column and the first source/drain of the memory transistor located in the second row and also in the fourth column are respectively connected to different ground lines (VSS), the second sources/drains of the memory transistors are both connected to the third bit line in the bit line group BL3 (M4-coding as shown in FIG. 6), and the gates of the two memory transistors are respectively connected to the word lines WL0 and WL1; in this case, the data stored in both memory transistors each is "11".

Referring to FIG. 7, FIG. 7 is a code truth diagram of the memory structure provided in the first implementation of the present disclosure. As shown in FIG. 7, in the case that the first source/drain is not connected to the ground line and no first, second, and third connection pads are provided on the second source/drain, data "00" is stored in the memory transistor; in the case that the first source/drain is connected to the ground line, the first connection pad is provided on the second source/drain and no second and third connection pads are provided on the second source/drain, data "01" is stored in the memory transistor; in the case that the first source/drain is connected to the ground line, the second connection pad is provided on the second source/drain and no first and third connection pads are provided on the second source/drain, data "10" is stored in the memory transistor; and in the case that the first source/drain is connected to the ground line, the third connection pad is provided on the second source/drain and no first and second connection pads are provided on the second source/drain, data "11" is stored in the memory transistor.

In the above technical solution, the data stored in the memory transistor is determined based on the connection ways of the first source/drain and the second source/drain. Different memory transistors store different data, so the first sources/drains and the second sources/drains of different memory transistors each cannot be shared.

Figure 8:
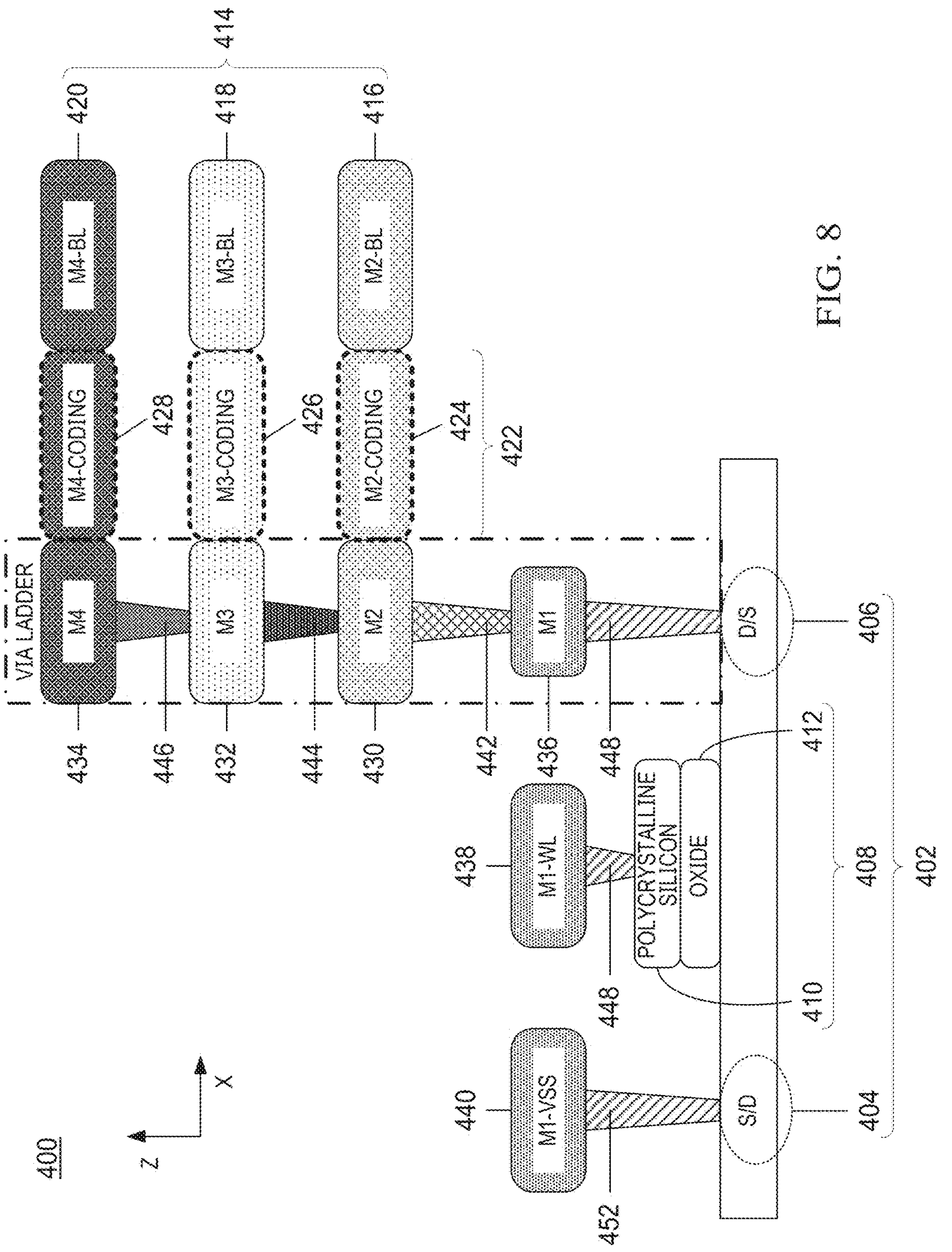
FIG. 8 is a structure schematic diagram of a memory structure provided in a second implementation of the present disclosure.

Referring to FIG. 8, FIG. 8 is a structure schematic diagram of the memory structure provided in the second implementation of the present disclosure. As shown in FIG. 8, in some implementations, the memory structure 400 further comprises: a plurality of connection pillars 452, which are configured to connect the first source/drain 404 of the memory transistor 402 and the ground line 440, and the first source/drain 404 of the plurality of memory transistors 402 arranged in the X direction are connected to the same ground line 440.

Here, the connection pillar 452 is provided on the first source/drain 404, and there is no need of coding regarding whether a coding contact structure is provided on the first source/drain 404 or not.

Figure 9:
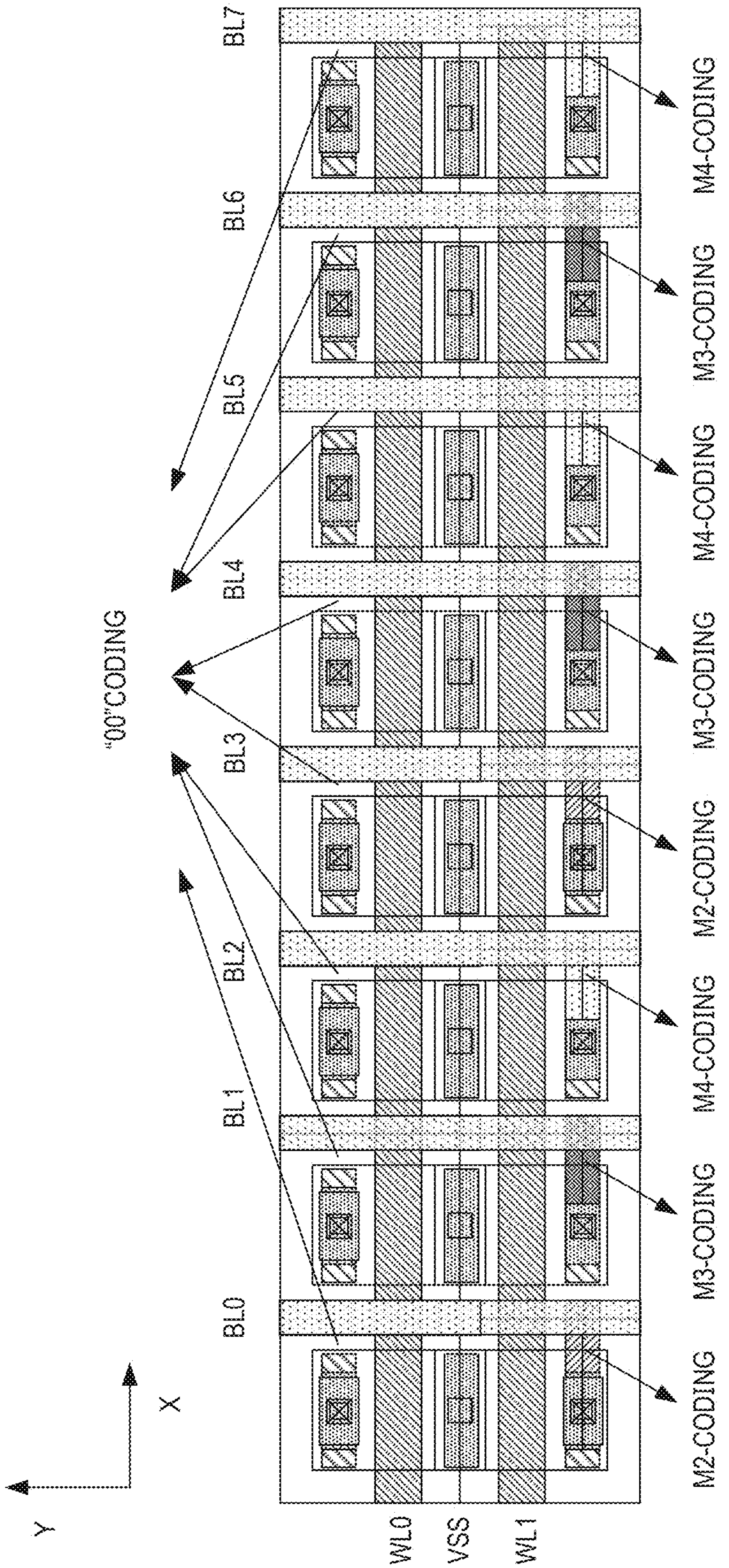
FIG. 9 is a layout of the memory structure provided in the second implementation of the present disclosure.

Referring to FIG. 9, FIG. 9 is a layout diagram of the memory structure provided in the second implementation of the present disclosure. As shown in FIG. 9, the memory structure comprises a plurality of memory transistors arranged in an array along the X and Y directions, for example, 16 memory transistors arranged in 2 rows×8 columns; a plurality of bit line groups extending along the Y direction and arranged sequentially along the X direction, namely BL0, BL1, BL2, BL3, BL4, BL5, BL6, and BL7 respectively; a plurality of word lines extending along the X direction and arranged sequentially along the Y direction, namely WL0 and WL1 respectively; and a plurality of ground lines extending along the X direction and arranged sequentially along the Y direction, such as VSS.

In some implementations, two memory transistors adjacent along the Y direction share the same first source/drain; and two memory transistors adjacent along the Y direction share the same ground line. As such, it can further save the occupied area of the memory structure and improve storage density.

Here, the memory transistors in the first row and the memory transistors in the second row share the same ground line (VSS as shown in FIG. 9). The eight memory transistors in the first row each are not provided with the first connection pad, the second connection pad, and the third connection pad, and in this case, the data stored in the eight memory transistors in the first row each is "00".

Here, the second source/drain of the memory transistor in the second row and also in the first column is connected to the first bit line in the bit line group BL0, and the second source/drain of the memory transistor in the second row and also in the fourth column is connected to the first bit line in the bit line group BL3. In this case, both of the memory transistor in the second row and also in the first column and the memory transistor in the second row and also in the fourth column are provided with the first connection pad, as shown by M2-coding in FIG. 9, and the stored data each is "01".

Here, the second source/drain of the memory transistor in the second row and also in the second column is connected to the second bit line in the bit line group BL1, the second source/drain of the memory transistor in the second row and also in the fifth column is connected to the second bit line in the bit line group BL4, and the second source/drain of the memory transistor in the second row and also in the seventh column is connected to the second bit line in the bit line group BL6. In this case, the memory transistor in the second row and also in the second column, the memory transistor in the second row and also in the fifth column, and the memory transistor in the second row and also in the seventh column are all provided with the second connection pad, as shown by M3-coding in FIG. 9, and the stored data each is "10".

Here, the second source/drain of the memory transistor in the second row and also in the third column is connected to the third bit line in the bit line group BL2, the second source/drain of the memory transistor in the second row and also in the sixth column is connected to the third bit line in the bit line group BL5, and the second source/drain of the memory transistor in the second row and also in the eighth column is connected to the third bit line in the bit line group BL7. In this case, the memory transistor in the second row and also in the third column, the memory transistor in the second row and also in the sixth column, and the memory transistor in the second row and also in the eighth column are all provided with the third connection pad, as shown by M4-coding in FIG. 9, and the stored data each is "11".

Referring to FIG. 10, FIG. 10 is a code truth diagram of the memory structure provided in the second implementation of the present disclosure. As shown in FIG. 10, in the case of not providing the first connection pad, the second connection pad, and the third connection pad on the second source/drain, data "00" is stored in the memory transistor; in the case of providing the first connection pad on the second source/drain and not providing the second and third connection pads on the second source/drain, data "01" is stored in the memory transistor; in the case of providing the second connection pad on the second source/drain and not providing the first and third connection pads on the second source/drain, data "10" is stored in the memory transistor; and in the case of providing the third connection pad on the second source/drain and not providing the first and second connection pads on the second source/drain, data "11" is stored in the memory transistor.

Figure 11:
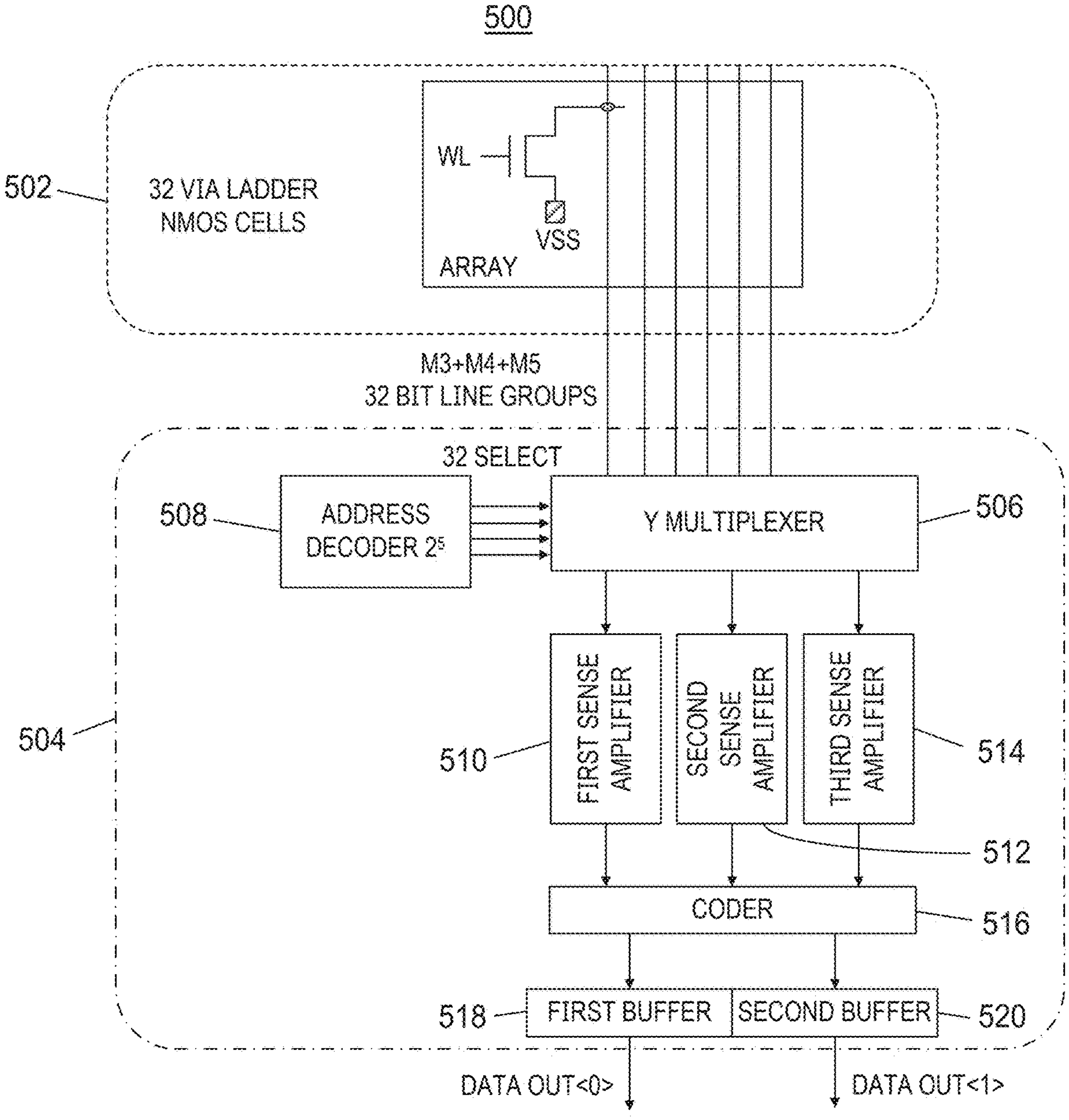
FIG. 11 is a schematic diagram of a memory with a peripheral circuit provided in an implementation of the present disclosure.

Referring to FIG. 11, FIG. 11 is a schematic diagram of a memory with a peripheral circuit provided in an implementation of the present disclosure. As shown in FIG. 11, an implementation of the present disclosure provides a memory 500, which comprises a memory structure 502 (as shown by the dashed box in FIG. 11) as described in the above technical solution; and a peripheral circuit 504 (as shown by the dotted box in FIG. 11) coupled to the memory structure 502. There is no special limitation on the number of the memory transistors comprised in the memory structure 502 in the present disclosure. FIG. 11 illustrates that the memory structure 502 comprises 32 NMOS transistors for illustrative purposes only and does not constitute a limitation on the scope of protection of the present disclosure.

Here, the gate of the NMOS transistor is connected to the word line, the first source/drain of the NMOS transistor is connected to the ground line, and the second source/drain of the NMOS transistor is correspondingly connected to 32 bit line groups. Combining with FIGS. 5 and 8, the programming of the NMOS transistor is achieved based on whether the second source/drain of the NMOS transistor is connected to the bit line or not and which bit line in the bit line group it is connected to.

In some implementations, the peripheral circuit 504 comprises: a plurality of multiplexers 506, each multiplexer 506 being connected to one bit line in each bit line group; wherein the number of the multiplexers 506 is the same as the number of the bit lines.

Here, 32 NMOS transistors correspond to 32 bit line groups, each bit line group comprising 3 bit lines comprising the first, second, and third bit lines, and each bit line being connected to one multiplexer.

Here, the multiplexer 506 can be a Y multiplexer.

In some implementations, the peripheral circuit 504 further comprises an address decoder 508 connected to the plurality of multiplexers 506 and configured to determine a selected memory transistor of the plurality of memory transistors.

Here, the address decoder can comprise a row address decoder and a column address decoder. The row address decoder is configured to determine the selected row in the memory transistor array, the column address decoder is configured to determine the selected column in the memory transistor array, and the memory transistor at the intersection of the selected row and the selected column is the selected memory transistor. The 32 NMOS transistors illustrated in FIG. 11 can be arranged in an array of 1 row×32 columns, therefore, the address decoder illustrated in FIG. 11 can be a column address decoder. The column address decoder determines $(\frac{1}{2}^{5})\times 32$ bit line groups of 32 bit line groups, that is, determining 1 bit line group. In this case, the determined bit line group is the bit line group corresponding to the selected memory transistor.

In some implementations, the peripheral circuit 504 further comprises: a first sensing amplifier 510 configured to sense a first potential on the first bit line corresponding to the selected memory transistor; a second sensing amplifier 512 configured to sense a second potential on the second bit line corresponding to the selected memory transistor; a third sensing amplifier 514 configured to sense a third potential on the third bit line corresponding to the selected memory transistor.

Here, the first sensing amplifier 510, the second sensing amplifier 512, and the third sensing amplifier 514 are respectively connected to the first, second, and third bit lines in the determined bit line group, for respectively sensing the first potential, the second potential, and the third potential.

In some implementations, the peripheral circuit 504 further comprises a coder 516 connected to the first sensing amplifier 510, the second sensing amplifier 512, and the third sensing amplifier 514, and configured to determine the data stored in the selected memory transistor based on the first potential, the second potential, and the third potential.

Here, if all of the first potential, the second potential, and the third potential do not decrease, it indicates that the selected memory transistor is not turned on, and the second source/drain of the selected memory transistor is not connected to the first, second, and third bit lines in the bit line group. In this case, the data stored in the memory transistor is "00". If the first potential decreases and the second and third potentials do not decrease, it indicates that the selected memory transistor is turned on and the second source/drain of the selected memory transistor is connected to the first bit line in the bit line group. In this case, the data stored in the memory transistor is "01". If the second potential decreases and the first and third potentials do not decrease, it indicates that the selected memory transistor is turned on and the second source/drain of the selected memory transistor is connected to the second bit line in the bit line group. In this case, the data stored in the memory transistor is "10". If the third potential decreases and the first and second potentials do not decrease, it indicates that the selected memory transistor is turned on and the second source/drain of the selected memory transistor is connected to the third bit line in the bit line group. In this case, the data stored in the memory transistor is "11".

In some implementations, the memory transistor stores two bits of data, and the peripheral circuit 504 further comprises: a first buffer 518 connected to the coder 516 and configured to store one bit of data of the selected memory transistor; and a second buffer 520 connected to the coder 516 and configured to store another bit of data of the selected memory transistor.

Here, the first buffer 518 can be configured to store and output 1 bit of data of the selected storage transistor, e.g. data out<0>; and the second buffer 520 can be configured to store and output another bit of data of the selected storage transistor, e.g. data out<1>.

In some implementations, the memory 500 comprises: a read-only memory.

Figure 12:
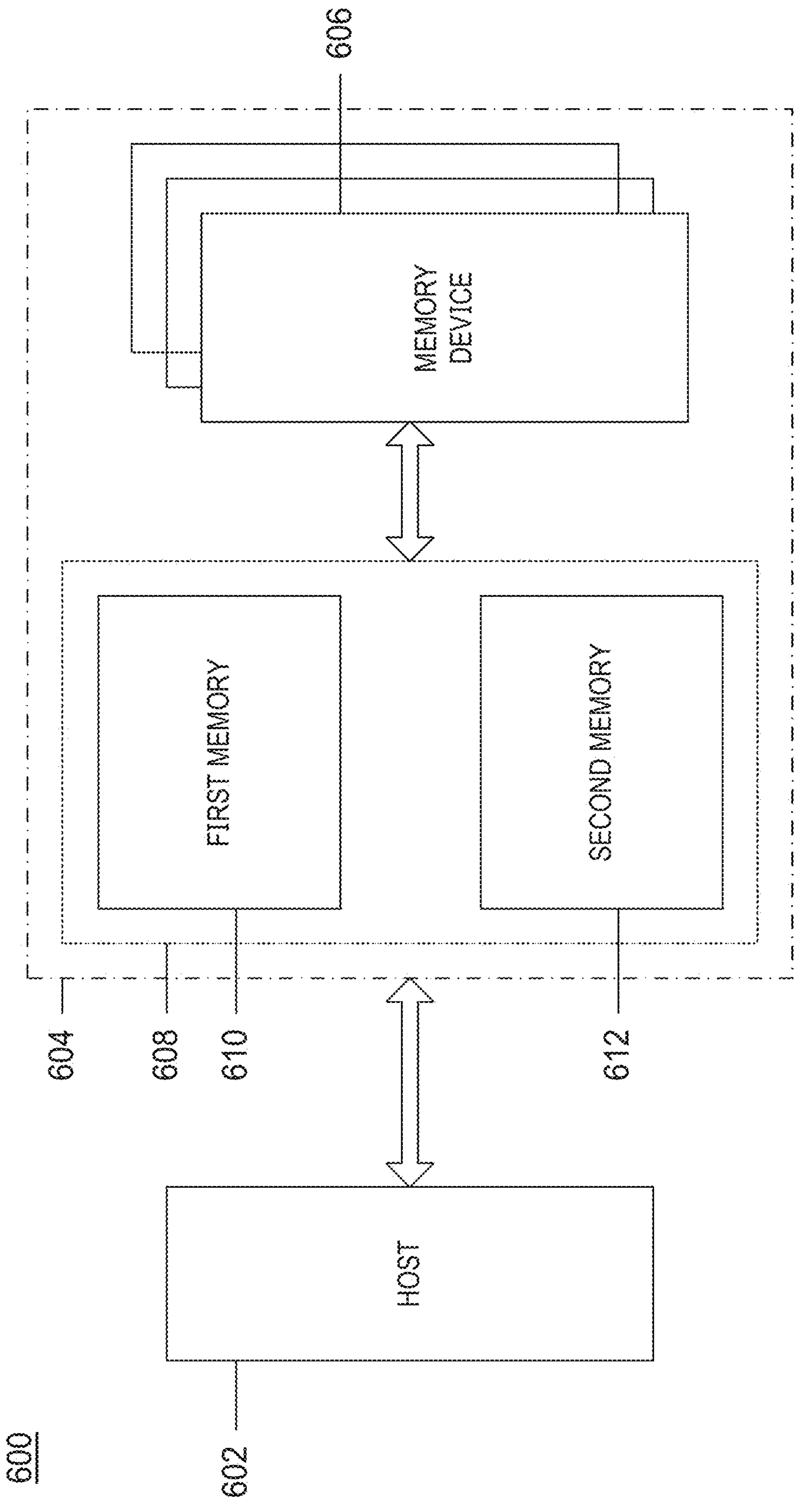
FIG. 12 is a block diagram of an electronic device provided in an implementation of the present disclosure.

Referring to FIG. 12, FIG. 12 is a block diagram of an electronic device provided in an implementation of the present disclosure. As shown in FIG. 12, an implementation of the present disclosure provides an electronic device 600, which comprises a host 602 and a memory system 604 (as shown by the dotted box in FIG. 12). The memory system 604 comprises a memory device 606 configured to store data; and a controller 608 (as shown by the dashed box in FIG. 12) coupled to the memory device 606 and configured to control the memory device 606. The controller 608 comprises a first memory 610 and a second memory 612, wherein the first memory 610 may comprise the read-only memory in the aforementioned technical solution, and the second memory may comprise a RAM.

Here, the electronic device 600 can be a mobile phone, a desktop computer, a laptop, a tablet, a vehicle computer, a game console, a printer, a positioning device, a wearable electronic device, a smart sensor, a virtual reality (VR) device, an augmented reality (AR) device, or any other suitable electronic device with a memory device therein.

Here, the electronic device 600 may comprise the host 602 and the memory system 604 which may have one or more memory devices 606 and the controller 608. The host 602 can be a processor of the electronic device (such as a central processing unit (CPU)) or a system on chip (SoC) (such as an application processor (AP)). The host 602 can be configured to send data to or receive data from the memory device 606.

In some implementations, the controller 608 is coupled to the memory device 606 and the host 602, and is configured to control the memory device 606. The controller 608 can manage data stored in the memory device 606 and communicate with the host 602. For example, the memory device 606 may comprise a NAND type flash memory device.

In some implementations, the controller 608 is designed to operate in low duty cycle environments, such as secure digital (SD) cards, compact flash (CF) cards, universal serial bus (USB) flash drives, or other media used in electronic devices such as personal calculators, digital cameras, mobile phones, etc.

In some implementations, the controller 608 is designed to operate in a high duty cycle environment such as solid state drives (SSDs) or embedded multi-media cards (eMMCs), which serves as a data storage for mobile devices such as smartphones, tablets, laptops, and enterprise storage arrays.

The controller 608 can be configured to control the operations of the memory device 606, such as reading, erasing, and programming operations. The controller 608 can also be configured to manage various functions related to data stored or to be stored in the memory device 606, comprising but not limited to bad block management, garbage collection, the conversion of logical address to physical address, loss balancing, etc. In some implementations, the controller 608 is also configured to process error correcting codes (ECC) regarding data read from or written to the memory device 606.

The controller 608 can also perform any other suitable functions, such as formatting the memory device 606. The controller 608 can communicate with external devices (such as the host 602) based on specific communication protocols. For example, the controller 608 can communicate with external devices through at least one of various interface protocols, such as a USB protocol, an MMC protocol, a peripheral component interconnect (PCI) protocol, a PCI Express (PCI-E) protocol, an advanced technology attachment (ATA) protocol, a serial ATA protocol, a parallel ATA protocol, a small computer system interface (SCSI) protocol, an enhanced small drive interface (ESDI) protocol, an integrated drive electronics (IDE) protocol, a firewire protocol, etc.

The controller 608 and one or more memory devices 606 can be integrated into various types of memory apparatus, for example, comprised in the same package (e.g. universal flash storage (UFS) package or eMMC package). That is to say, the memory system 604 can be implemented and packaged into different types of end electronic products.

Implementations of the present disclosure provide a memory structure, a memory, and a memory system. The memory structure comprises: a plurality of memory transistors arranged in an array along a first direction and a second direction; and a plurality of bit line groups extending along the first direction and arranged along the second direction, each of which comprises a first bit line, a second bit line, and a third bit line extending along the first direction and arranged along a third direction; wherein the memory transistor is connected to any one of the first bit line, the second bit line, and the third bit line in the same bit line group, or the memory transistor is not connected to the first bit line, the second bit line, and the third bit line in the same bit line group; the first direction intersects with the second direction, and both of the first direction and the second direction are perpendicular to the third direction. In an implementation of the present disclosure, the memory structure comprises: a plurality of memory transistors arranged in an array along a first direction and a second direction; and a plurality of bit line groups extending along the first direction and arranged along the second direction, each of which comprises a first bit line, a second bit line, and a third bit line extending along the first direction and arranged along a third direction. The data stored in the memory transistor is determined by a connection relationship between the memory transistor and the first bit line, the second bit line, and the third bit line in the bit line group. As such, each memory transistor in the memory structure can store 2 bits of data, which can improve the storage density of the memory structure.

It should be understood that references throughout the specification to "one implementation" or "an implementation" imply that specific features, structures, or characteristics related to the implementation are comprised in at least one implementation of the present disclosure. Therefore, terms "in one implementation" or "in an implementation" appearing throughout the entire specification may not necessarily refer to the same implementation. In addition, these specific features, structures, or characteristics can be combined in any suitable way in one or more implementations. It should be understood that in the various implementations of the present disclosure, the size of the sequence numbers of the above-mentioned processes does not imply the order of execution. The execution order of each process should be determined by its function and internal logic, and should not constitute any limitation on the implementation process of the implementation of the present disclosure. The above sequence numbers of the implementations of the present disclosure are for description only and do not represent the advantages or disadvantages of the implementations.

The above are only example implementations of the present disclosure and do not limit the scope of the patent of the present disclosure. Any equivalent structure changes made employing the content of the description and the accompanying drawings of the present disclosure, or directly/indirectly applied in other related technical fields, are comprised in the scope of patent protection of the present disclosure.

What is claimed is:

1. A memory structure comprising:

memory transistors arranged in an array along a first direction and a second direction;

a plurality of bit line groups extending along the first direction and arranged along the second direction, each of which comprises a first bit line, a second bit line, and a third bit line extending along the first direction and arranged along a third direction; and a plurality of connections pads comprising a first connection pad, a second connection pad and a third connection pad, wherein the memory transistor is connected to the first bit line through the first connection pad, or the memory transistor is connected to the second bit line through the second connection pad, or the memory transistor is connected to the third bit line through the third connection pad, wherein either:

a memory transistor of the memory transistors is connected to any one of the first bit line, the second bit line, and the third bit line in the same bit line group through a connection pad of the plurality of connection pads; or the memory transistor is not connected to the first bit line, the second bit line, and the third bit line in the same bit line group, wherein the first direction intersects with the second direction, and wherein both of the first direction and the second direction are perpendicular to the third direction.

2. The memory structure according to claim 1, wherein different data stored in the memory transistor is determined based on a connection relationship between the memory transistor and the different connection pads.

3. The memory structure according to claim 1, wherein a number of data "01" stored in the memory structure is determined based on a number of the first connection pad;

a number of data "10" stored in the memory structure is determined based on a number of the second connection pad; and a number of data "11" stored in the memory structure is determined based on a number of the third connection pad.

4. The memory structure according to claim 1, wherein the memory structure further comprises:

a first metal layer, a second metal layer and a third metal layer sequentially connected to the memory transistor, wherein the first metal layer is configured to connect the memory transistor and the first connection pad, the second metal layer is configured to connect the memory transistor and the second connection pad, and the third metal layer is configured to connect the memory transistor and the third connection pad.

5. The memory structure according to claim 4, wherein when data "00" is stored in the memory transistor, the memory transistor is not connected to the first bit line, the second bit line and the third bit line in the same bit line group;

when data "01" is stored in the memory transistor, the memory transistor is connected to the first bit line through the first metal layer and the first connection pad;

when data "10" is stored in the memory transistor, the memory transistor is connected to the second bit line through the second metal layer and the second connection pad; and when data "11" is stored in the memory transistor, the memory transistor is connected to the third bit line through the third metal layer and the third connection pad.

6. The memory structure according to claim 4, wherein the memory transistor comprises a gate, and the memory structure further comprises:

a plurality of word lines extending along the second direction and arranged along the first direction, with each of the word lines connected to the gates of the memory transistors arranged along the second direction.

7. The memory structure according to claim 6, wherein the word line is located at a fourth metal layer; and wherein the fourth metal layer is located at a layer different from each of the first metal layer, the second metal layer and the third metal layer.

8. The memory structure according to claim 1, wherein the memory structure further comprises:

a plurality of ground lines extending along the second direction and arranged along the first direction.

9. The memory structure according to claim 8, wherein each memory transistor comprises a source and a drain; and the memory structure further comprises:

a plurality of connection pillars configured to connect one of the source or drain of the memory transistor to the ground line, and the one of the source or drain of each of the memory transistors arranged along the second direction are connected to the same ground line.

10. The memory structure according to claim 9, wherein:

two of the memory transistors adjacent along the first direction share the same one of the source or drain; and two of the memory transistors adjacent along the first direction share the same ground line.

11. A memory comprising:

a peripheral circuit coupled comprising:

a first sensing amplifier configured to sense a first potential on a first bit line corresponding to a selected memory transistor of a plurality of memory transistors;

a second sensing amplifier configured to sense a second potential on a second bit line corresponding to the selected memory transistor; and a third sensing amplifier configured to sense a third potential on a third bit line corresponding to the selected memory transistor; and a memory structure coupled to the peripheral circuit and comprising:

the plurality of memory transistors, arranged in an array along a first direction and a second direction; and a plurality of bit line groups extending along the first direction and arranged along the second direction, each of which comprises the first bit line, the second bit line, and the third bit line extending along the first direction and arranged along a third direction, wherein either:

a memory transistor of the memory transistors is connected to any one of the first bit line, the second bit line, and the third bit line in the same bit line group through a connection pad of the plurality of connection pads; or the memory transistor is not connected to the first bit line, the second bit line, and the third bit line in the same bit line group, wherein the first direction intersects with the second direction, and wherein both of the first direction and the second direction are perpendicular to the third direction.

12. The memory according to claim 11, wherein the peripheral circuit comprises:

a plurality of multiplexers, each of which is connected to one bit line in each of the bit line groups, wherein a number of the multiplexers is the same as a number of the bit lines.

13. The memory according to claim 12, wherein the peripheral circuit further comprises:

an address decoder connected to the plurality of multiplexers and configured to determine the selected memory transistor of the plurality of memory transistors.

14. The memory according to claim 11, wherein the peripheral circuit further comprises:

a coder connected to the first sensing amplifier, the second sensing amplifier and the third sensing amplifier and configured to determine data stored in the selected memory transistor based on the first potential, the second potential, and the third potential.

15. The memory according to claim 14, wherein two bits of data are stored in the memory transistor, and the peripheral circuit further comprises:

a first buffer connected to the coder and configured to store one bit of data of the selected memory transistor; and a second buffer connected to the coder and configured to store another bit of data in the selected memory transistor.

16. The memory according to claim 11, wherein the memory comprises: a read-only memory.

17. A memory system comprising:

a memory device configured to store data; and a controller coupled to the memory device and configured to control the memory device, and the controller comprises a memory, wherein the memory comprises:

a memory structure; and a peripheral circuit coupled to the memory structure, wherein the memory structure comprises:

a plurality of memory transistors arranged in an array along a first direction and a second direction;

a plurality of bit line groups extending along the first direction and arranged along the second direction, each of which comprises a first bit line, a second bit line, and a third bit line extending along the first direction and arranged along a third direction; and a plurality of connections pads comprising a first connection pad, a second connection pad and a third connection pad, wherein the memory transistor is connected to the first bit line through the first connection pad, or the memory transistor is connected to the second bit line through the second connection pad, or the memory transistor is connected to the third bit line through the third connection pad, wherein either:

a memory transistor of the memory transistors is connected to any one of the first bit line, the second bit line, and the third bit line in the same bit line group through a connection pad of the plurality of connection pads; or the memory transistor is not connected to the first bit line, the second bit line, and the third bit line in the same bit line group, wherein the first direction intersects with the second direction, and wherein both of the first direction and the second direction are perpendicular to the third direction.

18. The memory system according to claim 17, wherein different data stored in the memory transistor is determined based on a connection relationship between the memory transistor and the different connection pads.

19. The memory system according to claim 17, wherein:

a number of data "01" stored in the memory structure is determined based on a number of the first connection pad;

a number of data "10" stored in the memory structure is determined based on a number of the second connection pad; and a number of data "11" stored in the memory structure is determined based on a number of the third connection pad.

20. The memory system according to claim 17, wherein the memory structure further comprises:

a first metal layer, a second metal layer and a third metal layer sequentially connected to the memory transistor, wherein the first metal layer is configured to connect the memory transistor and the first connection pad, the second metal layer is configured to connect the memory transistor and the second connection pad, and the third metal layer is configured to connect the memory transistor and the third connection pad.

* * * * *